United States Patent
Halls et al.

(10) Patent No.: US 8,502,356 B2
(45) Date of Patent: Aug. 6, 2013

(54) ORGANIC THIN FILM TRANSISTORS

(75) Inventors: Jonathan J. Halls, Cambridge (GB); Craig Edward Murphy, Teddington (GB); Gregory Whiting, Mountain View, CA (US); Sadayoshi Hotta, Osaka (JP)

(73) Assignees: Cambridge Display Technology Limited, Cambridgeshire (GB); Panasonic Corporation, Kadoma-Shi, Osaka (JP)

(*) Notice: Subject to any disclaimer, the term of this patent is extended or adjusted under 35 U.S.C. 154(b) by 0 days.

(21) Appl. No.: 12/987,724

(22) Filed: Jan. 10, 2011

(65) Prior Publication Data

US 2011/0101323 A1     May 5, 2011

Related U.S. Application Data

(63) Continuation of application No. 12/143,676, filed on Jun. 20, 2008, now Pat. No. 7,867,813.

(30) Foreign Application Priority Data

Jun. 22, 2007 (GB) .................................. 0712268.2

(51) Int. Cl.
*H01L 23/58* (2006.01)
*H01L 29/08* (2006.01)
*H01L 51/00* (2006.01)

(52) U.S. Cl.
USPC ...................... 257/642; 257/40; 257/E51.003

(58) Field of Classification Search
USPC ............ 257/40, E51.003, E51.005, E21.461, 257/E21.535, 642; 438/99
See application file for complete search history.

(56) References Cited

U.S. PATENT DOCUMENTS

| | | | |
|---|---|---|---|
| 5,176,786 A | 1/1993 | Debe | |
| 7,671,448 B2 | 3/2010 | Furukawa et al. | |
| 2002/0045289 A1 | 4/2002 | Dimitrakopoulos et al. | |
| 2002/0106847 A1* | 8/2002 | Kazlas et al. | 438/200 |
| 2004/0061104 A1* | 4/2004 | Bao et al. | 257/40 |
| 2005/0029514 A1 | 2/2005 | Moriya | |
| 2005/0035333 A1* | 2/2005 | Gerlach | 252/500 |
| 2005/0263025 A1 | 12/2005 | Blees | |
| 2006/0044500 A1 | 3/2006 | Nakagawa et al. | |
| 2006/0060840 A1* | 3/2006 | Hanna et al. | 257/40 |
| 2006/0113526 A1 | 6/2006 | Hanna et al. | |

(Continued)

FOREIGN PATENT DOCUMENTS

| | | |
|---|---|---|
| EP | 1 679 752 | 7/2006 |
| EP | 1 684 360 | 7/2006 |

OTHER PUBLICATIONS

Combined Search and Examination Report for GB 0712268.2 dated Oct. 23, 2007.

*Primary Examiner* — Caridad Everhart
(74) *Attorney, Agent, or Firm* — Marshall, Gerstein & Borun LLP

(57) ABSTRACT

A method of forming an organic thin film transistor comprising source and drain electrodes with a channel region therebetween, a gate electrode, a dielectric layer disposed between the source and drain electrodes and the gate electrode, and an organic semiconductor disposed in at least the channel region between the source and drain electrodes, said method comprising: seeding a surface in the channel region with crystallization sites prior to deposition of the organic semiconductor; and depositing the organic semiconductor onto the seeded surface whereby the organic semiconductor crystallizes at the crystallization sites forming crystalline domains in the channel region.

16 Claims, 3 Drawing Sheets

U.S. PATENT DOCUMENTS

| | | |
|---|---|---|
| 2006/0208266 A1 | 9/2006 | Yamamoto |
| 2006/0255336 A1 | 11/2006 | Kim |
| 2006/0281332 A1* | 12/2006 | Duinveld et al. ............ 438/780 |
| 2006/0289859 A1 | 12/2006 | Yoneya |
| 2007/0012914 A1 | 1/2007 | Miura et al. |
| 2007/0117298 A1 | 5/2007 | Fujimori et al. |
| 2007/0126003 A1 | 6/2007 | Ando et al. |
| 2008/0277648 A1 | 11/2008 | Wakita |

* cited by examiner

ORGANIC THIN FILM TRANSISTORS

CROSS-REFERENCE TO RELATED APPLICATION

This is a continuation of copending U.S. patent application Ser. No. 12/143,676 (now U.S. Pat. No. 7,867,813), filed Jun. 20, 2008, the entire respective disclosure of which is incorporated by reference in its entirety.

FIELD OF INVENTION

The present invention relates to organic thin film transistors.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector, and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as P-type and N-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and inject holes or electrodes. For example, a P-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an N-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance.

Transistors can be formed by depositing the components in thin films to form thin film transistors. When an organic material is used as the semi-conductive material in such a device, it is known as an organic thin film transistor.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulting material disposed between the gate electrode and the semi-conductive material in the channel region.

An example of such an organic thin film transistor is shown in FIG. 1. The illustrated structure may be deposited on a substrate (not shown) and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to show more clearly the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor (OSC) 8 is deposited in the channel region 6 and may extend over at least a portion of the source and drain electrodes 2, 4.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the device (channel between the source and drain electrodes). Thus, in order to achieve high drain currents with low operational voltages, organic thin film transistors must have an organic semiconductor which has highly mobile charge carriers in the channel region.

The application of organic thin film transistors is currently limited by the relatively low mobility of organic semiconductor materials. It has been found that one of the most effective means of improving mobility is to encourage the organic material to order and align. This minimizes intermolecular spacing and encourages inter-chain hopping which is the predominant conduction mechanism in organic semiconductors. The highest mobility organic semiconductor materials in thin film transistors show substantial ordering and crystallization, which is evident from optical micrography and X-ray spectroscopy.

Techniques for enhancing crystallization of the organic semiconductor in an organic thin film transistor include: (i) thermal annealing of the organic thin film transistor after deposition of the organic semiconductor; and (ii) designing the organic semiconductor molecules such that the organic semiconductor inherently has an increased ability to crystallize after deposition.

The present inventors have identified some problems with the aforementioned methods of enhancing crystallization in organic thin film transistor devices. One problem with the thermal annealing technique is that the device must be heated. This can damage components of the device, increase energy costs for the manufacturer, and increase the processing time required to manufacture such devices. One problem with the molecular design route is that it is time consuming and expensive to design new molecules with increased ability to crystallize. Furthermore, modifying the molecular structure of the organic semiconductor can detrimentally affect the functional properties of the material in the resulting thin film transistor. Additionally, modifying the molecular structure of the organic semiconductor can detrimentally affect the processability of the material during manufacture of organic thin film transistors. For example, the solubility of the material can be affected such that the material becomes difficult to solution process using deposition techniques such as spin coating or ink jet printing.

The present inventors have identified yet further problems which are common to both the aforementioned techniques. One problem is that both techniques result in an increase in crystallization throughout the organic semiconductor layer. The present inventors have realised that it may not be desirable to increase the crystallinity, and thus the conductivity, of the organic semiconductor in regions outside the active channel region as this may lead to current leakage at the sides of the device and shorting problems between underlying and overlying metallisation. As such, the present inventors have realised that it would be advantageous to provide a method of increasing crystallization of the organic semiconductor only in the active channel region of an organic thin film transistor.

Furthermore, neither technique allows the orientation of the organic molecules to be readily controllable as the semiconductor crystallizes. As stated previously, inter-chain hopping is the predominant conduction mechanism in organic semiconductors. If the organic molecules crystallize in an orientation which is perpendicular to a direction from the source electrode to drain electrode, then the number of hops required for a charge carrier to move from the source electrode to the drain electrode may be increased thus reducing conductivity. The present inventors have thus realised that it would be advantageous to provide a method of increasing crytallisation which also encourages the organic molecules to align in a direction from the source electrode to the drain electrode so as to reduce the number of hops required for a charge carrier to move from the source to the drain.

It is one aim of embodiments of the present invention to provide a solution to one or more of the problem discussed above.

SUMMARY OF INVENTION

According to a first aspect of the present invention, there is provided a method of forming an organic thin film transistor comprising source and drain electrodes with a channel region therebetween, a gate electrode, a dielectric layer disposed between the source and drain electrodes and the gate electrode, and an organic semiconductor disposed in at least the channel region between the source and drain electrodes, said method comprising: seeding a surface in the channel region with crystallization sites prior to deposition of the organic semiconductor; and depositing the organic semiconductor onto the seeded surface whereby the organic semiconductor crystallizes at the crystallization sites forming crystalline domains in the channel region.

This present invention provides a technique for enhancing crystallization in the channel region of an organic thin film transistor by seeding the crystallization process in the channel region. The present invention avoids the need for the application of heat as is required in the thermal annealing technique. As a result, damage caused by such heating is avoided. Furthermore, energy costs and processing time required to manufacture such devices is reduced.

In addition, the technique increases the crystallinity of the organic semiconductor without requiring a modification in the molecular structure of the organic semiconductor material, thus avoiding the time and expense involved in designing new molecules. Furthermore, detrimental effects in the functional and processing properties of the organic semiconductor material, which may occur due to a modification in the molecular structure of the organic semiconductor, are avoided. For example, a known organic semiconductor can be selected for its functional and processing properties, and the present technique can then be used in order to increase the crystallinity of the material when it is deposited in the channel region of an organic thin film transistor.

Further still, embodiments of the present invention provide a method of increasing crystallization of the organic semiconductor only in the active channel region of an organic thin film transistor. As stated previously, the present inventors have realised that it may not be desirable to increase the crystallinity, and thus the conductivity, of the organic semiconductor in regions outside the active channel region as this may lead to current leakage at the sides of the device and shorting problems between underlying and overlying metallisation. By using the present seeding technique, an increase in crystallization can be localized in the channel region such that the organic semiconductor has a higher conductivity in this region relative to regions of the organic semiconductor outside the channel region. Accordingly, current leakage and shorting problems can be reduced.

According to one embodiment, the organic semiconductor is deposited in a solvent onto the seeded surface in the channel region and the solvent is evaporated. As the solvent evaporates the organic semiconductor crystallizes at the crystallization sites forming crystalline domains in the channel region.

Solution processable organic semiconductor materials are mobile during the initial stages of film formation. As the solvent evaporates, and the solution becomes increasingly concentrated, intermolecular interactions eventually prevent further molecular rearrangements. During the more mobile phase, seed sites on the surface in the channel region may be used to encourage crystallization and alignment.

This technique may also be used to initialise the crystallization of vacuum or gas phase deposited materials, e.g. small molecule materials. The presently proposed seeding method can enhance crystallization of both solution processed and vacuum deposited organic semiconductor materials.

According to one arrangement, the organic thin film transistor is a bottom-gate organic thin film transistor and the method comprises: forming the gate electrode on the substrate; forming the dielectric layer over the gate electrode; forming the source and drain electrodes over the dielectric layer, the source and drain electrodes being spaced apart with the channel region therebetween located over the gate electrode; and depositing organic semiconductor in at least the channel region between the source and drain electrodes, wherein, prior to depositing the organic semiconductor, the exposed surface of the dielectric layer in the channel region is seeded with crystallization sites.

According to an alternative arrangement, the organic thin film transistor is a top-gate organic thin film transistor and the method comprises: forming the source and drain electrodes over the substrate, the source and drain electrodes being spaced apart with the channel region therebetween; depositing organic semiconductor in at least the channel region between the source and drain electrodes; forming the dielectric layer over the organic semiconductor; and depositing the gate electrode over the dielectric layer, wherein prior to depositing the organic semiconductor, the exposed surface of the substrate in the channel region is seeded with crystallization sites.

Preferably the crystallization sites are less than 10 μm in size.

The crystallization sites may comprise physical structures. For example, the physical structures may comprise indentations in the surface onto which the organic semiconductor is deposited. The indentations may be formed, for example, by pressing a stamp into the surface. The surface may be pretreated with a material which can then be stamped in order to form the indentations. Alternatively, the physical structures may be provided by forming a raised pattern on the surface onto which the organic semiconductor is deposited. For example, a patterned layer may be transferred from a stamp.

The physical structures may be aligned/orientated in a direction from the source to the drain electrode in such a way that the organic semiconductor is encouraged to crystallize to form domains that are aligned in a direction from the source to the drain electrode.

As an alternative to seeding the surface in the channel with physical structures, the surface can be seeded using a chemical approach. Crystallization sites may be formed by localized wetting domains in an anti-wetting matrix. For example, the localized wetting domains and the anti-wetting matrix may be formed by transferring material from a stamp to the surface onto which the organic semiconductor is deposited. Alternatively, the localized wetting domains and the anti-wetting matrix may be formed by depositing a mixture of wetting and anti-wetting material.

In one particularly preferred embodiments, the wetting and anti-wetting material form a phase separated mixture. For example, the phase separated mixture may comprise wetting material dissolved in a first solvent and anti-wetting material dissolved in a second solvent, the first and second solvents being immiscible. This embodiment provides a good way of defining wetting domains in an anti-wetting matrix. The mixture may also comprise a surfactant. A surfactant can be utilized to control the size of the wetting domains.

One or both of the wetting domains and the anti-wetting matrix may comprise molecules having attachment groups which attach the molecules to the surface onto which the organic semiconductor is deposited. This will serve to anchor the seeding molecules to the surface and prevent mixing with the organic semiconductor when it is deposited thereon. Furthermore, by anchoring the seeding molecules to the surface, they will not detrimentally effect the functioning of the final device, for example, by migrating through the organic semiconductor. An example of a suitable attachment group for attachment to a silicon dioxide surface is a siloxane.

The wetting domains will usually comprise molecules having a polar end group. In one preferred example, the wetting domain comprises molecules having an oligomer end group which is also present in the organic semiconductor. By providing the same chemical structures in the organic semiconductor and on the surface in the channel region, good seeding and crystallization is achieved.

The anti-wetting matrix will usually comprises molecule have a hydrophobic end group. For example, the molecules may be fluorinated.

In order to promote orientation of the crystal domains in a direction from the source to the drain electrode so as to increase conductivity and reduce the number of hops required for a charge carrier to pass from the source to the drain, the transistor may be switched on prior to drying of the organic semiconductor to align the crystalline domains.

According to another aspect of the present invention, there is provided an organic thin film transistor comprising source and drain electrodes with a channel region therebetween, a gate electrode, a dielectric layer disposed between the source and drain electrodes and the gate electrode, and an organic semiconductor disposed in at least the channel region between the source and drain electrodes, wherein a surface in the channel region comprises crystallization sites and the organic semiconductor in the channel region comprises crystalline domains over the crystallization sites.

BRIEF DESCRIPTION OF THE DRAWINGS

The present invention will now be described in further detail, by way of example only, with reference to the accompanying drawings in which.

DETAILED DESCRIPTION OF THE PREFERRED EMBODIMENTS

Figure 3:
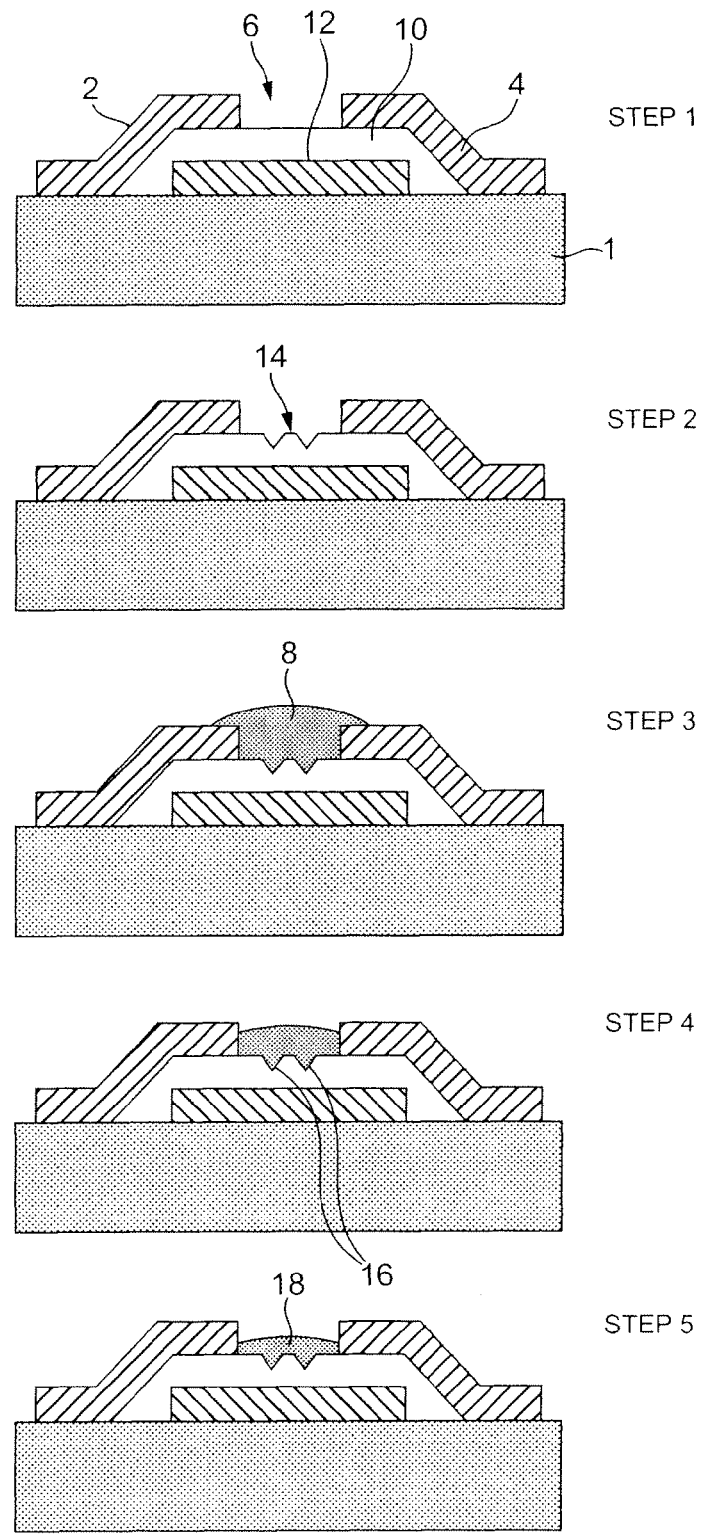
FIG. 3 illustrates the method steps involved in forming an organic thin film transistor according to an embodiment of the present invention.

An example method of how this technique may be carried out is shown schematically in FIG. 3.

In step 1, a substrate 1 is initially prepared by formation of a gate electrode 12, a dielectric layer 10, and source and drain contacts 2, 4 thereon (this is a bottom gate, bottom contact transistor architecture).

The electrodes can be printed or deposited using other simple patterning techniques which are known in the art.

The dielectric material may be solution processable. For example, the dielectric layer may be an organic photoresist such as a polyimide which can be readily spin coated and patterned. Alternatively, the dielectric layer may be an inorganic material such as $SiO_2$.

In step 2, the exposed surface of the dielectric layer in the channel region is treated to form crystallization sites. In the embodiment shown in FIG. 3, a physical seeding method is utilized in which the surface is stamped to form ordered nano-indentations 14. Methods for indenting the surface include using a photolithographically defined stamp that is placed in contact with the dielectric. Heat and pressure may be used to transfer the features from the stamp to the dielectric. The design of the stamp may be tailored to optimise the transferred pattern for nucleating crystallization. An example may include an array of pyramidal features on the stamp, leading to the formation of pyramidal indentations in the dielectric.

Random roughening of the surface may be used instead. However, while simple roughening of the dielectric with an abrasive material can also generate appropriate nucleation sites, damage to other areas of the device may be difficult to avoid with this method. Furthermore, simple roughening is not as controllable in terms of forming crystal domains have a certain size and orientation.

In step 3, an organic semiconductor solution is deposited. The organic semi-conductive material may be solution processable such that it can be deposited from solution by, for example, spin-coating or ink-jet printing. The organic semi-conductive material may comprise a polymer or dendrimer as these have proved to be good solution processable materials. Many such semi-conductive materials are known in the art, for example, conjugated polymers and dendrimers utilized in organic light-emissive devices.

An organic semiconductor with a tendency to order and crystallize is preferred. An organic semiconductor formulation containing a high boiling point solvent is also preferred, as this provides a longer time-frame for the molecules to rearrange and for nucleation to occur at the nucleation sites as the solvent evaporates more slowly. As an alternative to deposition from solution, the organic semiconductor may be deposited by vacuum processing. Examples of vacuum depositable materials include small molecule organic semiconductors such as pentacene.

In step 4, molecules dissolved in solution begin to crystallize at the nucleation sites 16. The solvent begins to evaporate and the solution becomes increasingly concentrated.

In step 5, the degree of ordering continues to increase as molecules align themselves with molecules that have already formed part of the polycrystalline structure 18. Eventually the intermolecular interactions prevent any further rearrangement as the solvent continues to evaporate and no further crystallization can occur. Depending on the particular organic semiconductor and formulation used, a combination of polycrystalline regions and amorphous regions is expected to exist in the final dry film. The mobility in the polycrystalline regions is expected to be limited by the transport across the boundaries between the ordered "grains". If areas of amorphous material are located between "grains" the hopping transport through these disordered domains may limit mobility.

Figure 1:
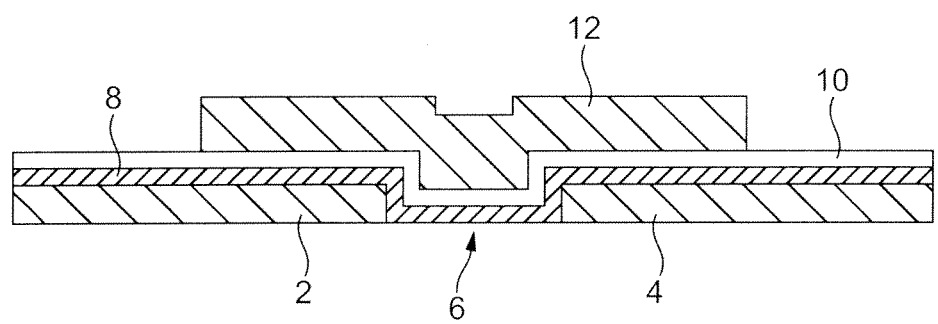
FIG. 1 shows a top-gate organic thin film transistor structure according to a prior art arrangement.
Figure 2:
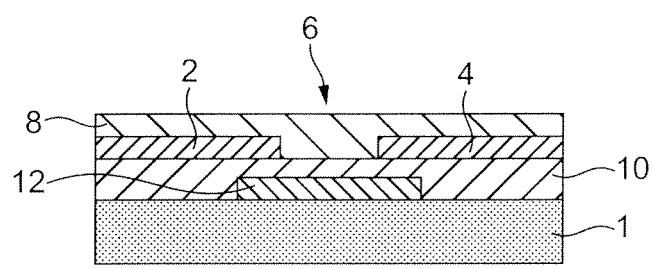
FIG. 2 shows a bottom-gate organic thin film transistor structure according to a prior art arrangement.

The resulting transistor has a similar structure to that illustrated in FIG. 2, which has been previously described in the background section. For reasons of clarity, the same reference numerals have been used as in FIG. 2 for common layers. The important difference is that in the arrangement illustrated in the final structure of FIG. 3, the surface of the dielectric layer in the channel region comprises crystallization sites and the organic semiconductor comprises polycrystalline regions.

Figure 4:
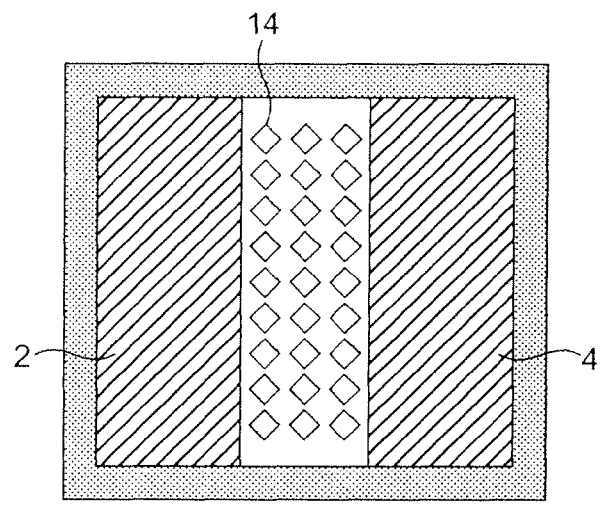
FIG. 4 shows a plan view of an intermediate product in the method of FIG. 3.

FIG. 4 shows a plan view of the intermediate product shown in step 2 of FIG. 3. Nano-indentations 14 are provided in the channel region on the surface of the gate dielectric between the source and drain electrodes 2, 4.

Figure 5:
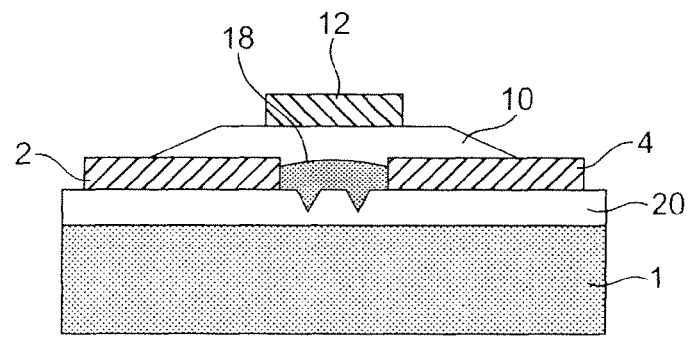
FIG. 5 illustrates an organic thin film transistor according to another embodiment of the present invention.

FIG. 3 illustrates the method steps in forming a bottom-gate organic thin film transistor. In contrast, FIG. 5 illustrates a top-gate organic thin film transistor. In this case, the exposed substrate in the channel region (or a pre-deposited coating that can be readily indented) is seeded to from the crystallization sites.

A substrate 1 is initially prepared by depositing a coating 20 that can be readily indented. Source and drain electrodes 2, 4 are formed on the coating 20. The surface of the coating 20 in the channel region between the source and drain electrodes is then seeded to form crystallization sites in a similar manner to that discussed above in relation to the dielectric surface in the bottom-gate arrangement. Organic semiconductor 18 is then deposited in at least the channel region and crystallizes as discussed in relation to the bottom-gate arrangement. The device is completed by depositing a gate dielectric layer 10 and a gate electrode 12.

In the above-described examples, the substrate or gate dielectric surface in the channel region is physically seeded. However, as an alternative, the substrate or gate dielectric surface in the channel region may be chemically seeded. This may be achieved by attaching local chemical groups that are attractive to particular chemical groups of the organic semiconductor. These groups will encourage crystal growth of the organic semiconductor.

Figure 6:
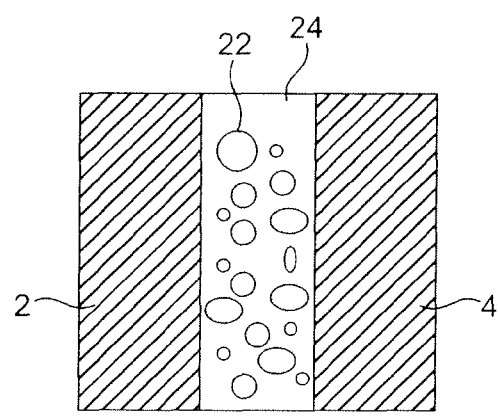
FIG. 6 shows a plan view of an intermediate product according to yet another embodiment of the present invention.

FIG. 6 shows a plan view of an intermediate product according to a chemical seeding method, in which a mixed, self assembled monolayer has been deposited in the channel region prior to deposition of the organic semiconductor.

By using a mixed self-assembled monolayer (SAM) it is possible to define a surface in the channel region with localised wetting domains in a matrix of anti-wetting domains. The localised wetting domains will cause local pinning of organic semiconductor molecules, promoting nucleation of crystal growth.

Advantageously, SAM molecules which will preferentially attach themselves to the channel region are utilized. SAM molecules with polar end groups are used to provide local wetting and nucleate crystallization. SAM molecules with hydrophobic end groups (e.g. fluorinated molecules) are used to provide an anti-wetting "background" that promotes movement of organic semiconductor molecules to the wetting regions.

By mixing together the wetting and antiwetting SAM molecules in an appropriate ratio, and by tailoring the SAM molecules and coating process to create the appropriate phase separation (using a surfactant if required in order to tune the phase separation), the SAM layer has localised wetting nucleation areas and a background of anti-wetting SAMs, as shown below in FIG. 6.

Although it is simplest to apply the mixed SAM (or physical indentations) across the whole device, it is preferred that this is localised to the channel region for the following reasons.

Organic semiconductor molecules flow from a wider area towards the growing ordered regions located in the channel.

Cross talk between adjacent thin film transistors is reduced. By reducing the mobility of the organic semiconductor (by preventing seeding) in regions away from the channel region, conductivity of the organic semiconductor in these regions is reduced. This is particularly useful for active matrix organic light emissive display (AMOLED) backplanes where transistors are in close proximity and may share the same well and organic semiconductor film. The less conductive uncrystallized regions of the organic semiconductor can reduce track leakage between lower and higher level metallization.

Formation of an insulating SAM layer on the source drain contacts themselves is avoided. This otherwise increases contact resistance and hinders performance.

For the mixed SAM, the attachment group is selected to adhere to the dielectric (for bottom-gate devices) or the substrate or substrate coating (for top-gate devices).

The density of nucleation sites is important in controlling crystallization. Too few nucleation sites and the crystalline regions may not extend between adjacent sites, leading to lower mobility of charge carriers as a result of intervening amorphous material. Too many nucleation sites, and the whole surface may become too pinning and prevent the formation of effective crystalline domains. That is, the mobility of the organic semiconductor may be hindered to such an extent that it cannot flow to nucleation sites to grow crystalline domains.

In light of the above, it is clear that the domain size may be controlled according to the layout of the nucleation sites.

Organic thin film transistors according to embodiments of the present invention have a wide range of possible applications. One such application is to drive pixels in an organic light-emissive display. Organic thin film transistors according to embodiments of the present invention have many common structural features with organic light-emissive displays and may be formed using similar techniques and materials. As such, according to one advantageous arrangement, the organic thin film transistors and the organic light-emissive pixels of an active matrix organic light-emissive display are formed on a common substrate.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. An organic thin film transistor comprising source and drain electrodes with a channel region therebetween, a gate electrode, a dielectric layer disposed between the source and drain electrodes and the gate electrode, and an organic semiconductor disposed in at least the channel region between the source and drain electrodes, wherein a bottom surface of the channel region comprises crystallization sites and the organic semiconductor in the channel region comprises crystalline domains over the crystallization sites, wherein the crystallization sites comprise localized wetting domains in an anti-wetting matrix, and wherein the crystallization sites are less than 10 μm in size.

2. An organic thin film transistor according to claim 1, wherein the organic semiconductor is disposed on a surface and the crystallization sites comprise indentations in the surface.

3. An organic thin film transistor according to claim 1, wherein the organic semiconductor is disposed on a surface and one or both of the wetting domains and the anti-wetting matrix comprise molecules having attachment groups for attaching the molecules to the surface on which the organic semiconductor is disposed.

4. An organic thin film transistor according to claim 3, wherein the surface on which the organic semiconductor is disposed comprises silicon dioxide and the attachment groups comprise a siloxane.

5. An organic thin film transistor according to claim 1, wherein the wetting domains comprise molecules having a polar end group.

6. An organic thin film transistor according to claim 1, wherein the wetting domains comprise molecules having an oligomer end group which is also present in the organic semiconductor.

7. An organic thin film transistor according to claim 1, wherein the anti-wetting matrix comprises molecules have a hydrophobic end group.

8. An organic thin film transistor according to claim 7, wherein the anti-wetting matrix comprises fluorinated molecules.

9. An organic light-emissive device comprising an organic thin film transistor comprising source and drain electrodes with a channel region therebetween, a gate electrode, a dielectric layer disposed between the source and drain electrodes and the gate electrode, and an organic semiconductor disposed in at least the channel region between the source and drain electrodes, wherein a bottom surface of the channel region comprises crystallization sites and the organic semiconductor in the channel region comprises crystalline domains over the crystallization sites, wherein the crystallization sites comprise localized wetting domains in an anti-wetting matrix, and wherein the crystallization sites are less than 10 μm in size.

10. An organic light-emissive device according to claim 9, wherein the wetting domains comprise molecules having a polar end group.

11. An organic light-emissive device according to claim 9, wherein the wetting domains comprise molecules having an oligomer end group which is also present in the organic semiconductor.

12. An organic light-emissive device according to claim 9, wherein the organic semiconductor is disposed on a surface and the crystallization sites comprise indentations in the surface.

13. An organic light-emissive device according to claim 9, wherein the organic semiconductor is disposed on a surface and one or both of the wetting domains and the anti-wetting matrix comprise molecules having attachment groups for attaching the molecules to the surface on which the organic semiconductor is disposed.

14. An organic light-emissive device according to claim 13, wherein the surface on which the organic semiconductor is disposed comprises silicon dioxide and the attachment groups comprise a siloxane.

15. An organic light-emissive device according to claim 9, wherein the anti-wetting matrix comprises molecules have a hydrophobic end group.

16. An organic light-emissive device according to claim 15, wherein the anti-wetting matrix comprises fluorinated molecules.

* * * * *